(12) United States Patent
Kim

(10) Patent No.: US 11,848,489 B2
(45) Date of Patent: Dec. 19, 2023

(54) ANTENNA MODULE

(71) Applicant: KESPION Co., Ltd., Incheon (KR)

(72) Inventor: Hee Su Kim, Gyeonggi-do (KR)

(73) Assignee: KESPION Co., Ltd., Incheon (KR)

(*) Notice: Subject to any disclaimer, the term of this patent is extended or adjusted under 35 U.S.C. 154(b) by 213 days.

(21) Appl. No.: 17/585,799

(22) Filed: Jan. 27, 2022

(65) Prior Publication Data
US 2022/0149515 A1   May 12, 2022

Related U.S. Application Data

(63) Continuation-in-part of application No. PCT/KR2020/018018, filed on Dec. 10, 2020.

(51) Int. Cl.
*H01Q 1/38* (2006.01)
*H01Q 1/52* (2006.01)

(52) U.S. Cl.
CPC ............. *H01Q 1/38* (2013.01); *H01Q 1/526* (2013.01)

(58) Field of Classification Search
CPC ................................. H01Q 1/38; H01Q 1/526
See application file for complete search history.

(56) References Cited

FOREIGN PATENT DOCUMENTS

| EP | 1 677 387 A1 | 7/2006 |
|---|---|---|
| JP | 2007-214754 A | 8/2007 |
| KR | 10-1326111 B1 | 11/2013 |
| KR | 10-1595026 B1 | 2/2016 |
| KR | 10-2017-0017416 A | 2/2017 |
| KR | 10-1991275 B1 | 6/2019 |

OTHER PUBLICATIONS

International Search Report for PCT/KR2020/018018 dated Mar. 23, 2021.

*Primary Examiner* — Graham P Smith
(74) *Attorney, Agent, or Firm* — The PL Law Group, PLLC

(57) ABSTRACT

An antenna module according to an embodiment of the present disclosure includes an antenna implemented by an LDS method. The antenna module may be used in a wireless communication terminal. The thickness of the antenna module may be reduced, and the radiation performance of the antenna may be improved by effectively shielding against electromagnetic waves by providing a shielding layer for shielding against electromagnetic waves on the opposite side of a carrier where the LDS antenna is formed.

7 Claims, 3 Drawing Sheets

ANTENNA MODULE

CROSS-REFERENCE TO RELATED APPLICATION AND CLAIM OF PRIORITY

The present application is a continuation in part of application to International Application No. PCT/KR2020/018018 with an International Filing Date of Dec. 10, 2020, which claims the benefit of Korean Patent Applications No. 10-2019-0166129 filed on Dec. 12, 2019 at the Korean Intellectual Property Office, the disclosures of which are incorporated by reference herein in their entirety.

BACKGROUND

1. Technical Field

The present invention relates to an antenna module, and more specifically, to an antenna module that is capable of, by implementing an antenna included in an antenna module used in a wireless communication terminal using a laser direct structuring (LDS) method, reducing the thickness of the antenna module, as well as being capable of improving radiation performance of the antenna by effectively shielding against electromagnetic waves by providing a shielding layer for shielding against electromagnetic waves on the opposite side of a carrier where the LDS antenna is formed.

2. Background Art

A wireless communication terminal needs to essentially include an antenna. Existing external antennas deteriorate the external appearance and cause inconvenience to users. Recently, technology development for internal antennas has been actively carried out.

Meanwhile, the demand for multimedia data communication as well as the call function, which is the basis of a wireless communication terminal, has recently increased rapidly, and accordingly, a wireless communication terminal equipped with a plurality of antennas is required. In addition, the demand for NFC (Near Field Communication) antennas is increasing to implement functions such as information exchange, payment, ticket reservation, and wireless charging between terminals in addition to long-distance wireless communication. For this reason, there is a trend that the wireless communication terminal is equipped with an NFC antenna.

An NFC antenna used in the conventional wireless communication terminal uses a flexible printed circuit board (FPCB). However, when using the FPCB, the antenna module may become thick due to the thickness of the FPCB, so there is a problem that it goes against the recent trend of slimming the wireless communication terminal for improving the portability of the wireless communication terminal.

SUMMARY

Accordingly, the technical task of the present invention has been conceived in this regard, and the present invention provides an antenna module that is capable of, by implementing an antenna included in an antenna module used in a wireless communication terminal using an LDS method, reducing the thickness of the antenna module, as well as being capable of improving radiation performance of the antenna by effectively shielding against electromagnetic waves by providing a shielding layer for shielding against electromagnetic waves on the opposite side of a carrier where the LDS antenna is formed.

According to an embodiment of the present invention, there is provided an antenna module that includes: an antenna carrier; an LDS (Laser Direct Structuring) antenna formed on one surface of the antenna carrier; and a shielding layer formed on the other surface of the antenna carrier to shield electromagnetic waves.

The shielding layer may be configured to correspond to an outer peripheral shape of the LDS antenna.

The shielding layer may include ferrite.

An FPCB (Flexible Printed Circuit Board) antenna may be formed on one side of the antenna carrier.

A nano-sheet layer may be formed on one surface of the FPCB antenna.

A contact circuit may be formed on the other surface of the antenna carrier, and the LDS antenna and the contact circuit may be electrically connected to each other.

The LDS antenna and the contact circuit may be connected to each other through a via hole.

Effects of the present invention may not be limited to the above, and other effects that are not mentioned will be clearly understandable to those having ordinary skill in the art from the appended claims.

According to an embodiment of the present invention, an antenna included in an antenna module used in a wireless communication terminal can be implemented through an LDS method to reduce the thickness of the antenna module, thereby making the wireless communication terminal in a slim structure.

In addition, since a shielding layer for shielding electromagnetic waves is provided on the surface opposite to the carrier where the LDS antenna is formed, it is possible to shield the electromagnetic waves transmitted from the outside, thereby improving the radiation performance of the antenna.

Effects of the present invention may not be limited to the above, and other effects that are not mentioned will be clearly understandable to those having ordinary skill in the art from the appended claims.

BRIEF DESCRIPTION OF THE DRAWINGS

The summary described above as well as the detailed description of the exemplary embodiments of the present application to be described below may be better understood when read in conjunction with the accompanying drawings. For the purpose of illustrating the present invention, exemplary embodiments are shown in the drawings. However it should be understood that the present application is not limited to the arrangements and means shown in the drawings.

DETAILED DESCRIPTION OF THE EMBODIMENTS

Figure 1:
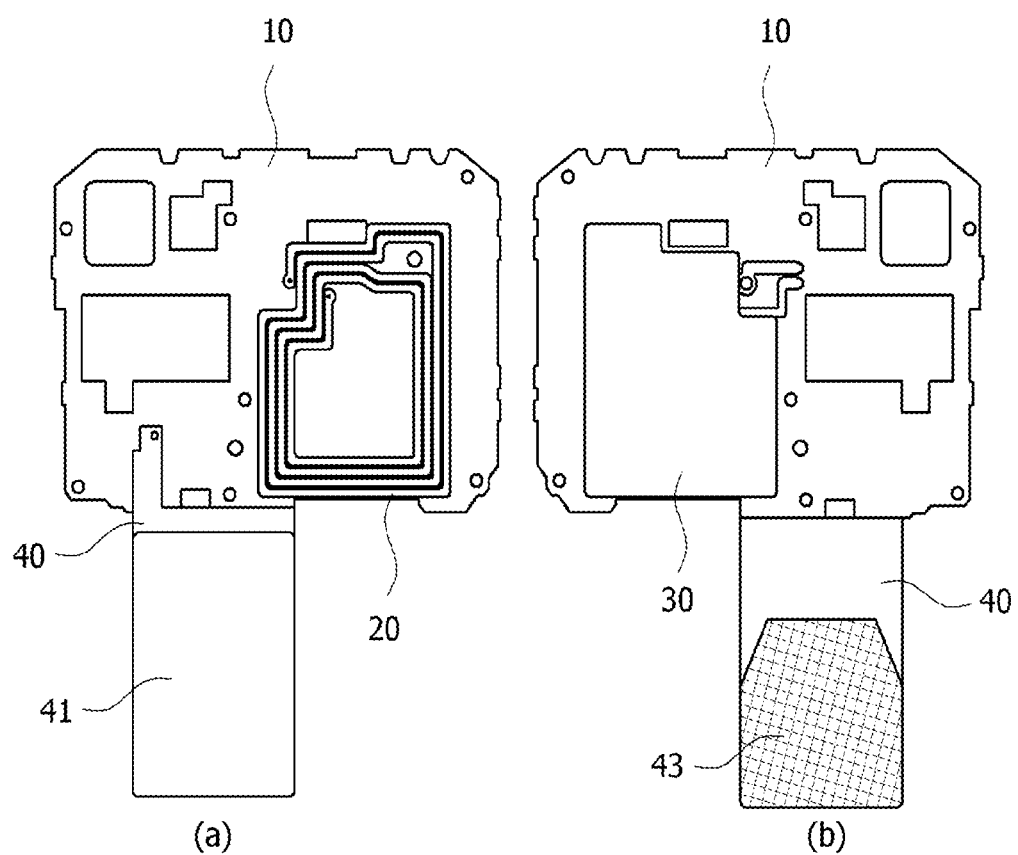
FIG. 1 is a reference view for explaining an antenna module according to an embodiment of the present invention, in which (a) is a front surface of the antenna module, and (b) is a rear surface of the antenna module.

Hereinafter, various embodiments of the present invention will be described in detail with reference to the accompanying drawings. However, the features of the embodiment disclosed in the present specification will be more clearly understood from the accompanying drawings and should not be limited by the accompanying drawings. It will be readily apparent to those skilled in the art that the scope of the present invention is not limited to the scope of the accompanying drawings.

In describing the embodiments of the present invention, the same names and reference numerals are used for the components having the same functions, and it is stated in advance that they are not substantially the same as the components of the related art.

Terms used in this disclosure are used to describe specified examples of the present invention and are not intended to limit the scope of the present invention. The terms of a singular form may include plural forms unless otherwise specified. In the present invention, terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Hereinafter, an antenna module according to the present invention will be described in detail with reference to accompanying drawings. In the following description, the same reference numerals will be assigned to the same or corresponding elements and redundant description thereof will be omitted.

Figure 2:
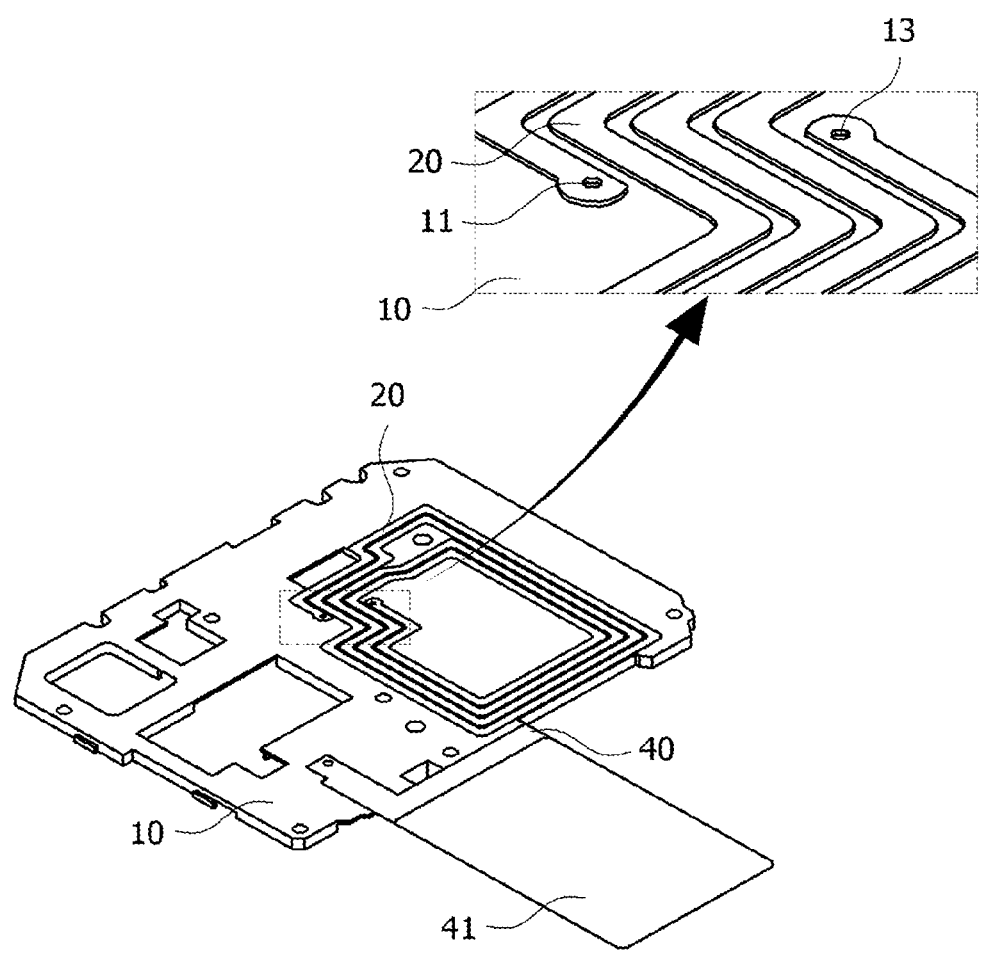
FIG. 2 shows a perspective view and a partially enlarged view of a front surface of the antenna module according to an embodiment of the present invention.
Figure 3:
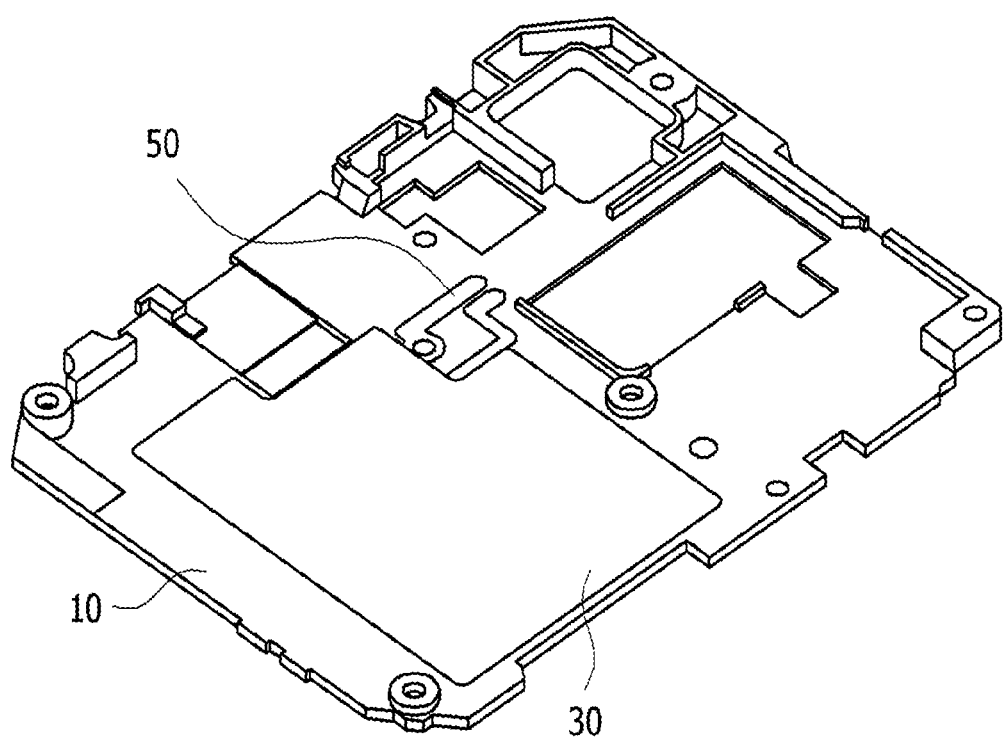
FIG. 3 is a perspective view of a rear surface of the antenna module according to an embodiment of the present invention.

FIG. 1 is a reference view for explaining an antenna module according to an embodiment of the present invention, FIG. 2 shows a perspective view and a partially enlarged view of a front surface of the antenna module according to an embodiment of the present invention, and FIG. 3 is a perspective view of a rear surface of the antenna module according to an embodiment of the present invention.

The antenna module according to the present embodiment is installed in a wireless communication terminal to wirelessly transmit/receive data.

The antenna module according to an embodiment of the present invention may include an antenna carrier 10, a first LDS antenna, and a shielding layer 30.

In this case, the antenna carrier 10 may be formed of a synthetic resin material such as a polyester resin, polycarbonate (PC) and the like in order to maintain the atmospheric corrosion resistance, impact resistance and mechanical strength of the antenna carrier 10. The antenna carrier 10 may be mounted on a main board (not shown) of the wireless communication terminal.

The LDS antenna 20 is used for transmission and reception of an electronic signal (for example, a wireless communication signal) and may have a configuration that receives power from a PCB and radiates an electronic signal into a space, and may be provided in the antenna carrier 10 to transmit or receive a wireless signal.

LDS antenna 20 may be formed on one surface of the antenna carrier (10). In this case, one surface of the antenna carrier 10 may mean an upper portion in the drawing. The LDS antenna 20 may be formed by a laser direct structure (LDS) method in which a radiation pattern is formed on one surface of the injection-molded antenna carrier 10 and the radiation pattern is plated.

The LDS method means a process that forms a structure using a material containing a non-conductive and chemically stable heavy metal complex, and exposes a part of the structure to a laser such as a UV (Ultra Violet) laser, an excimer laser, etc., thereby exposing a metal seed by breaking the chemical bonds of the structure and metallizing the structure to form a conductive material on the laser-exposed portion of the structure. The conductive material may be formed by plating a plating solution on a radiation pattern formed through the LDS method, the plating solution may include copper and nickel, and the plating may be performed by an electrolytic plating method or an electroless plating method. The radiation pattern may be formed as a meander line in order to effectively receive an external signal.

In this case, the LDS antenna 20 may be an NFC (Near Field Communication) antenna for short-range communication.

Since the LDS antenna 20 is implemented through the LDS method rather than the method using the FPCB antenna 40, an antenna for wireless communication can be formed directly on the antenna carrier 10 that is injection molded, thereby reducing the overall thickness of the antenna, and thus the wireless communication terminal can be formed in a slim structure.

The shielding layer 30 may be formed on the other surface of the antenna carrier 10. The shielding layer 30 may be formed of a magnetic material, and may shield the electromagnetic waves generated from the LDS antenna 20 to collect the electromagnetic waves in a desired direction, or shield the electromagnetic waves generated from electronic components such as a PCB disposed on one surface of the antenna carrier 10 to suppress the electromagnetic interference.

According to the present embodiment, the shielding layer 30 may be disposed to be spaced apart from the LDS antenna 20 with the antenna carrier 10 interposed therebetween. Since the shielding layer 30 is spaced apart from the LDS antenna 20 with the antenna carrier 10 interposed therebetween without directly attaching the shielding layer 30 to the LDS antenna 20, the shielding performance for the electromagnetic waves can be improved, and accordingly, the antenna performance of the LDS antenna 20 can be improved.

In detail, a main board (not shown) may be disposed on the other side of the antenna carrier 10, and the antenna performance may be deteriorated due to the metal material of the main board (not shown). In order to solve the above problem, a shielding sheet may be provided on the antenna radiation pattern, but since the shielding sheet also contains a metal component, the antenna performance may be affected when the shielding sheet comes into contact with the antenna radiation pattern.

According to the present embodiment, the shielding layer 30 is spaced apart from the LDS antenna 20 with the antenna carrier 10 interposed therebetween without directly attaching the shielding layer 30 to the LDS antenna 20, so that an air layer is formed between the antenna carrier 10 and the shielding layer 30, thereby improving the antenna performance.

The shielding layer 30 may include ferrite. Specifically, the shielding layer 30 may be used as a single material such as a magnetic alloy or a ferrite sintered body, or may be used as a composite material which is obtained by mixing magnetic metal powder and/or ferrite powder with an insulating resin, rubber-based component, ceramic or non-magnetic metal, etc., and extruding, pressing, or film casting the composite material.

The shielding layer 30 may be prepared in the form of a plate-shaped sheet having a predetermined area, and the shielding layer 30 and the antenna carrier 10 may be bonded to each other through an adhesive layer (not shown).

In this case, the shielding layer 30 may be configured to correspond to the outer peripheral shape of the LDS antenna 20. It is necessary to optimize the width of the shielding layer 30 in order to improve the shielding performance for the electromagnetic waves within the limited size of the antenna carrier. According to the present embodiment, the shielding layer 30 may have the width corresponding to the outer peripheral shape of the LDS antenna 20. Referring to (a) and (b) of FIG. 1, the width of the shielding layer 30 may be formed to correspond to the shape of the antenna radiation line formed at the outermost of the LDS antenna 20. Since the shielding layer Since 30 is formed to correspond to the outer peripheral shape of the LDS antenna 20, the electromagnetic wave shielding performance in a limited space can be optimized.

The FPCB antenna 40 may be formed on one side of the antenna carrier 10. The FPCB is provided by forming an antenna pattern on a printed circuit board having excellent flexibility, and the antenna pattern may be formed as a meander line.

In this case, the FPCB antenna 40 may be provided with a protective film layer 41 for protecting the antenna pattern.

In addition, a nano-sheet layer 43 may be formed on one surface of the FPCB antenna 40. The protective film layer 41 may be formed on the surface where the antenna pattern is formed in order to protect the antenna pattern, and the nano-sheet layer 43 may be formed on the surface opposite to the surface where the protective film layer 41 is formed to improve the performance of the FPCB antenna 40 by absorbing the electromagnetic waves.

In this case, the FPCB antenna 40 may be a magnetic secure transmission (MST) antenna for magnetic payment.

According to the antenna module of the present embodiment, the NFC antenna is formed on the upper portion and the MST antenna is formed on the lower portion, so that the NFC function and the MST function can be simultaneously implemented.

Although the present embodiment has been described in that the MST (magnetic secure transmission) antenna is implemented as the FPCB antenna 40, the present invention is not limited thereto, and the MST antenna may also be an LDS antenna formed through the LDS method.

Meanwhile, a contact circuit 50 may be formed on the other surface of the antenna carrier 10. The contact circuit 50 may be formed on the other surface of the antenna carrier 10 (a surface opposite to the surface on which the LDS antenna 20 is formed). The contact circuit 50 may be formed through the LDS method, and since the LDS method is the same as the process for forming the LDS antenna 20 described above, a detailed description thereof will be omitted.

The contact circuit 50 may be electrically connected to the LDS antenna 20. In this case, the LDS antenna 20 and the contact circuit 50 may be electrically connected to each other through via holes 11 and 13. The via holes 11 and 13 may be formed through the antenna carrier 10 and may be prepared as a pair. In this case, upper portions of the via holes 11 and 13 may be connected to the LDS antenna 20 and lower portions of the via holes 11 and 13 may be connected to the contact circuit 50, so that the LDS antenna 20 and the contact circuit 50 may be electrically connected to each other.

An end of the contact circuit 50 may be connected to a PCB (not shown) to receive electric power, and an electrical signal may be transmitted to the LDS antenna 20 as the electric power is supplied from the electrical circuit.

According to the present embodiment, an electrical signal may be transmitted to the LDS antenna 20 through the contact circuit 50 to which current is applied, so that the LDS antenna 20 may function as an NFC antenna, and the FPCB antenna 40 formed at a lower portion of the antenna carrier 10 may function as an MST antenna, thereby simultaneously performing the NFC function and the MST function.

In addition, since the NFC antenna is implemented as the LDS antenna 20, the thickness of the antenna module can be reduced so that the wireless communication terminal can be slimmed/miniaturized, and the shielding layer 30 for shielding the electromagnetic waves is provided on the opposite surface of the carrier where the LDS antenna 20 is formed such that the shielding layer 30 corresponds to the LDS antenna 20, so that the electromagnetic waves can be effectively shielded, thereby improving the radiation performance of the LDS antenna 20.

Exemplary embodiments according to the present invention have been described above, and it is obvious to those skilled in the art that the present invention can be embodied in other specific forms without departing from the spirit or scope of the present invention in addition to the above-described embodiments. Therefore, the above-described embodiments are regarded as illustrative rather than restrictive, and accordingly, the present invention is not limited to the above description, but may be modified within the scope of the appended claims and their equivalents.

What is claimed is:

1. An antenna module comprising:
   an antenna carrier mounted on a main board of a wireless communication terminal and having an opening area in which electronic components are installed;
   a laser direct structuring (LDS) antenna for near field communication (NFC) formed on one surface of the antenna carrier in adjacent to the opening area of the antenna carrier;
   a contact circuit formed on the other surface of the antenna carrier, electrically connected to the LDS antenna, and configured to come into contact with a terminal of the main board; and
   a shielding layer formed on the other surface of the antenna carrier and having a shape and an area corresponding to a shape and an area of an outermost radiation pattern of the LDS antenna so as to overlap the LDS antenna,
   wherein the antenna carrier is configured to have a thickness greater than a sum of a thickness of the LDS antenna and a thickness of the shielding layer so that the shielding layer is spaced apart from the LDS antenna by the thickness of the antenna carrier.

2. The antenna module of claim 1, wherein the shielding layer is configured to correspond to an outer peripheral shape of the LDS antenna.

3. The antenna module of claim 1, wherein the shielding layer includes ferrite.

4. The antenna module of claim 1, wherein an FPCB (Flexible Printed Circuit Board) antenna is formed on one side of the antenna carrier.

5. The antenna module of claim 4, wherein a nano-sheet layer is formed on one surface of the FPCB antenna.

6. The antenna module of claim 1, wherein a contact circuit is formed on the other surface of the antenna carrier, and the LDS antenna and the contact circuit are electrically connected to each other.

7. The antenna module of claim 1, wherein the LDS antenna and the contact circuit are connected to each other through a via hole.

\* \* \* \* \*